DIFFUSION IN SEMICONDUCTOR MATERIAL

Filed April 30, 1959

INVENTOR
VINCENT J. LYONS

BY Alvin J. Riddles
ATTORNEY 3,070,466

DIFFUSION IN SEMICONDUCTOR MATERIAL

Vincent J. Lyons, Wappingers Falls, N.Y., assignor to International Business Machines Corporation, New York, N.Y., a corporation of New York Filed Apr. 30, 1959, Ser. No. 809,977
5 Claims. (Cl. 148—1.5)

This invention relates to semiconductor material and in particular to the control of a diffusion operation for introducing conductivity type determining impurities into a body of semiconductor material.

As the art of semiconductor device fabrication has developed, it has been determined that not only the quantity and type of conductivity type determining impurities present in the bulk of the semiconductor material is an important consideration in determining the output characteristics of the device ultimately made therefrom, but also the rate of change of concentration of a conductivity type determining impurity from one region of the bulk semiconductor material to another is of importance. It has been established in certain of the well-known semiconductor devices, for example, the drift transistor, that a gradient of concentration of conductivity type determining impurity from one portion of the base region of the transistor to another, will provide a drift field which enhances the flow of minority carriers and thereby improves the response of the device. One of the convenient ways established in the art of providing such a variation in concentration of conductivity type determining impurities is by the mechanism known as diffusion, wherein the bulk material and the conductivity type determining impurity are brought into contact with each other in the presence of sufficient thermal energy to permit the conductivity type determining impurity to penetrate into the bulk material. When the mechanism of diffusion is employed to introduce the conductivity type determining impurity, the impurity is found to enter and to be present in the bulk semiconductor material in an exponential gradient of concentration which varies from a high value at the surface to progressivey lower values with depth within the crystal.

However, the mechanism of diffusion has associated with it certain critical conditions resulting from the high temperature which unless rigorously controlled may cause contamination by imparting activity to minute quantities of impurities present in the environment and containing systems. Further, the high temperature requires extreme care to prevent thermal shocks from cracking the crystal.

What has been discovered is a technique of impurity diffusion whereby a plurality of individual diffusion operations may be performed from a solid coating, in a single temperature cycle, so that contamination and thermal shocks are markedly reduced. The technique of the invention involves the retaining of conductivity type determining impurities in contact with the surface of a semiconductor crystal in the form of an impurity oxide and selectively releasing a particular conductivity type determining impurity from its oxide for diffusion by chemical reduction employing the semiconductor material itself and a change in the environment surrounding the semiconductor crystal.

It is an object of this invention to provide an improved method of diffusing conductivity type determining impurities into a semiconductor crystal.

It is another object of this invention to provide for a plurality of diffusion operations into semiconductor material in a single temperature cycle.

It is still another object of this invention to provide a PNP type semiconductor body in a single temperature diffusion cycle.

It is another object of this invention to provide an improved diffusion technique for germanium.

It is another object of this invention to provide a PNP type germanium diffused structure.

It is another object of this invention to provide a PNP type gallium and antimony diffused germanium structure.

Other objects of the invention will be pointed out in the following description and claims and illustrated in the accompanying drawings which disclose by way of example, the principle of the invention and the best mode which has been contemplated of applying that principle.

Figure 1:
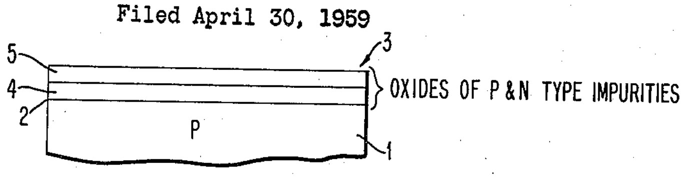
FIGURE 1 is a schematic illustration showing the application of the oxides of conductivity type determining impurities to a semiconductor crystalline substrate.

It has been discovered that a plurality of diffusion operations may be conducted, in a single temperature cycle, into semiconductor material by bringing conductivity type determining impurities into contact with he surface of the semiconductor material in the form of oxides of the conductivity type determining impurities such that, for a first portion of the diffusion, the semiconductor substrate may serve to reduce the oxide of a first conductivity type determining impurity and a subsequent change or series of sequential changes in the environment may then be employed to reduce one or more oxides of other conductivity type determining impurities. When this is done at a temperature sufficient for reasonably rapid diffusion, the particular conductivity type determining impurity when released from its oxide enters the semiconductor substrate in a concentration which varies inversely with depth, and, according to the original concentration of conductivity type determining impurities in the crystal, will either form regions of opposite conductivity type or vary the conductivity type existing in the crystal in the regions wheer it penetrates. Where the released impurity is in sufficient concentration and forms an eutectic alloy with the crystal, an alloy semiconductor connection may be formed.

In accordance with one aspect of the invention, the semiconductor crystal is coated with an oxide of a conductivity type determining impurity which is capable of being chemically reduced by the particular material of the semiconductor crystal substrate. For further diffusion, the substrate is also coated with an oxide or plurality of oxides of a semiconductor conductivity type determining impurity each being capable of being chemically reduced by an environment to be introduced around the substrate. The environment controlled oxides may conveniently differ from each other as to chemical reduction temperature or by the concentration required of the reducing agent.

The substrate is next subjected to a temperature cycle and maintained at a temperature sufficient for reasonably rapid diffusion in an environment free of contamination, as is customary in the semiconductor art. At the temperature of diffusion, the semiconductor substrate operates with respect to one of the oxides in contact with its surface to chemically reduce the oxide thereby freeing the conductivity type determining impurity that is one element making up the oxide. This impurity then diffuses into the semiconductor substrate.

The environment surrounding the substrate and in contact with the oxide is next changed in such a manner as to chemically reduce the remaining oxide or sequentially the oxides on the surface of the semiconductor substrate. Such reduction then frees the conductivity type determining impurities involved permitting further diffusion into the semiconductor substrate. The depth of the diffusion, and the change in conductivity type impurity concentration in the substrate will then be dependent on the time, the temperature, and the concentration of the respective conductivity type determining impurities and the material of the semiconductor substrate, in accordance with the rule that the conductivity type of the semiconductor material will be governed by the predominance of one conductivity type determining impurity over another at an individual location in the material, and, that the conductivity or its reciprocal, the resistivity of a semiconductor material will be governed by the net quantity of one conductivity type determining impurity over the other predominant in an individual location in the semiconductor substrate.

Referring now to FIGURE 1, a semiconductor substrate 1, which for example may be P conductivity type germanium, is provided having a surface 2 into which it is desired to diffuse conductivity type determining impurities. These impurities, as previously described, are brought into contact with the surface 2 in the form of oxides 3. For purposes of illustration, these oxides have been shown as two in number labelled layers 4 and 5. However, it is essential only that the oxides be present and it is not essential that they be present in the form of a layer as will become apparent in subsequent description. Further, as many oxides as needed and are controllable may be provided for as many diffusion operations as are essential to form a desired structure. If desired all chemical reduction operations may be done by changes in environmental conditions so long as they occur one at a time. In this manner the crystal need not serve as a reducing agent. The oxides in contact with the surface 2 are shown to be of P and N conductivity type determining impurities in an arrangement such that the N conductivity type will diffuse first into the P conductivity type substrate as is illustrated, to be followed by the P conductivity type impurity thereby forming a PNP structure, useful in transistor applications in the art.

A wide variety of alternatives of oxides of various types of conductivity type determining impurities may be employed in order to give the desired conductivity type pattern and resistivity profile desired in the ultimate device. A resistivity type profile may be described as a variation in resistivity of a semiconductor device from one location to another location in the device. For example, were the oxides 3 to be both of an N conductivity type determining impurity, but one having a higher diffusion coefficient than the other, then a gradient of N conductivity type would be produced upon diffusion into the P type crystal that would vary with one rate in the region into which the faster diffusing impurity penetrated and would vary at a different rate for the combination of first and second impurities in the region penetrated by the second or slower diffusing impurity.

Figure 2:
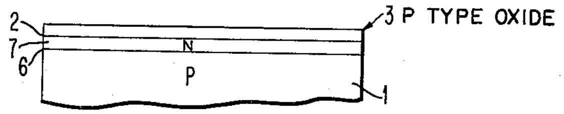
FIGURE 2 is a schematic illustration of a first diffusion operation employing the technique of this invention.

Referring next to FIGURE 2, in the presence of heat the first conductivity type determining impurity oxide is chemically reduced by the semiconductor substrate. For purposes of illustration, this oxide has been shown as the N conductivity type determining impurity oxide and in the presence of the heat, after dissociation the N conductivity type determining impurity diffuses into the P conductivity type substrate 1 through the surface 2 to a depth so as to form a PN junction 6 and a graded resistivity N region 7 having a variation in resistivity from a value which is high (low impurity concentration) at the junction 6 to progressively lower values near the surface 2. During this period, any conductivity type determining impurity oxide that is present but is not reduced by the substrate remains passive. Such an oxide has been illustrated as P type in FIGURE 2. It has been observed that oxides of conductivity type determining impurities that are electro-positive with respect to the substrate will remain passive during the first portion of the diffusion and that oxides of conductivity type determining impurities that are electro-negative with respect to the substrate, will be reduced by the substrate and partake in the diffusion operation.

Figure 3:
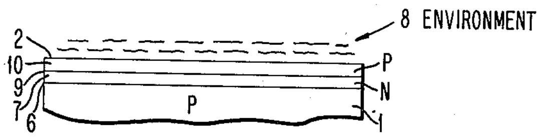
FIGURE 3 is an illustration of reduction of an impurity oxide by the environment in accordance with the invention.

Referring next to FIGURE 3, an environment shown as a gas 8 is brought into contact with the remaining oxide layer, while in the presence of heat sufficient for reasonably rapid diffusion. The gas 8 is made up of, or contains, a reducing agent which operates to chemically reduce the remaining oxide so as to free the conductivity type determining impurity for diffusion. Where a plurality of oxides are present, for more complicated diffusion operations, it may be advantageous to use a compatible combination of variations in temperature above that required for reasonably rapid diffusion or to use different concentrations or different agents for the reducing element in the environment so as to selectively free a desired conductivity type determining impurity for diffusion at a particular time. In FIGURE 3 in the presence of heat, the P conductivity type determining impurity enters the substrate in a concentration sufficient to predominate over the N conductivity type region 7 and to form a PN junction 9 and a P region 10. Where a plurality of oxides are employed, further structures of alternate N, P and N conductivity types may be constructed, and that the resistivity of each may be varied as desired. Where the impurity released by the oxide 3 is capable of forming a eutectic alloy with the crystal 1 and is in sufficient concentration an alloy type of junction will result at 9.

Figure 4:
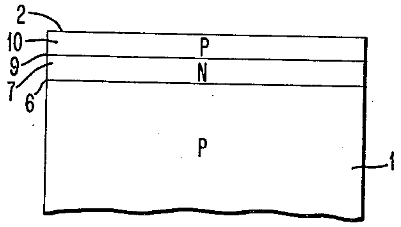
FIGURE 4 is an illustration of a PNP type structure made by the technique of this invention.

Referring now to FIGURE 4, upon cleaning, the structure of FIGURE 3, is as is illustrated in FIGURE 4 wherein the P conductivity type substrate 1 contains a PN junction 6 and an N region 7, formed by diffusion of the N conductivity type determining impurity where the substrate reduced the oxide containing that conductivity type determining impurity and a PN junction 9 and P type region 10 beneath the surface 2 formed when the environment 8 of FIGURE 3 reduced the oxide of the conductivity type determining impurity.

Figure 5:
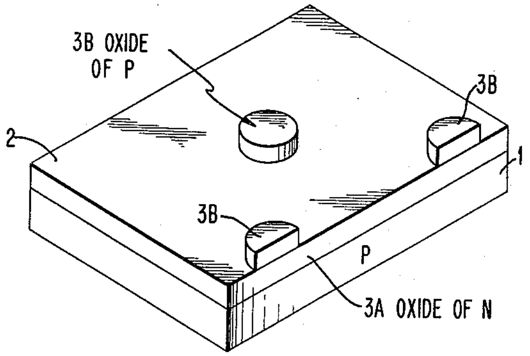
FIGURE 5 is an illustration of selective oxide positioning.
Figure 6:
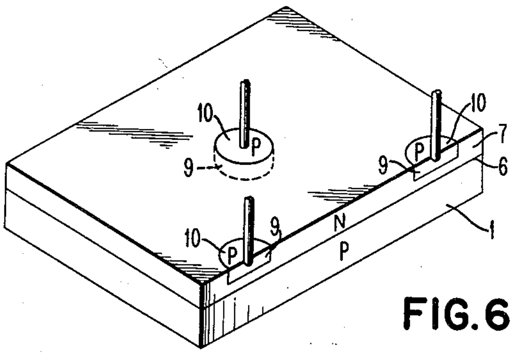
FIGURE 6 is an illustration of a matrix of semiconductor devices made through selective deposition of oxide in accordance with the principles of the invention.

It will be apparent that a wide variety of structures may be formed employing the teaching of this invention. One example of such a structure may be seen in connection with FIGURES 5 and 6 wherein in FIGURE 5, a P type substrate 1, may be coated with an oxide of a conductivity type determining impurity, for example N. This oxide is labelled 3A. Then, through a screening technique, small discrete areas of an oxide of a conductivity type determining impurity opposite to that of element 3A are deposited. These areas are labelled elements 3B. As previously described through the operations of a single heat cycle and change of environment, the oxide 3A is first reduced by the substrate 1 and the N conductivity type determining impurity diffuses into the P type substrate 1 as shown in FIGURE 6 forming a PN junction 6 and an N region 7, then second, the change in environment operates to reduce the oxide 3B and permits diffusion of the P conductivity type determining impurity, into the N region 7 forming a plurality of discrete P conductivity type regions 10 therein each separated by PN junction 9 forming thereby an example of a complete device matrix. In such structures as is shown in FIGURES 5 and 6, it is advantageous to employ as the element 3B, the oxide of a conductivity type determining impurity having a lower vapor pressure in order to prevent formation of a vapor phase which deposits on unwanted portions of the crystal. However, it has been found that even where this occurs, there is a substantial difference in depth such that an etching operation will remove the undesirable portions. It has been found that elements of group IIIB of the periodic table are as a class electro-positive with respect to the semiconductor material germanium and serve as acceptors when diffused therein, and the elements of group VB of the periodic table are as a class electro-negative with respect to the semiconductor material germanium and that their oxides may be reduced by germanium and they serve as donor conductivity type determining impurities when diffused therein. In view of this, in a situation where a coating of a group VB element oxide on a surface of a germanium body and a coating of a group IIIB element oxide are simultaneously present on the same surface of a germanium body in the presence of heat, sufficient for reasonably rapid diffusion, the germanium body will chemically reduce the oxide of the group VB element and permit the group VB element to diffuse into the germanium body. Where the conductivity type of the germanium body is P, and the concentration of the P conductivity type determining impurity is at a given value, then, when the quantity of N conductivity type determining impurity diffused into the body predominates over the quantity of P conductivity type determining impurity already present, a PN junction such as element 6 in FIGURE 2 will result, and an N conductivity type region having a variation in resistivity from a value which is high in the vicinity of the PN junction 6 to value which is progressively lower throughout the N conductivity type region determined by the net quantity of N conductivity type determining impurity present over P conductivity type determining impurity in the particular region will be produced. During the period of diffusion, the group IIIB conductivity type determining impurity remains passive because it is not reduced by the substrate and remains bound in the oxide, therefore, no diffusion of the group IIIB conductivity type determining impurity into the germanium occurs at this time. Upon termination of the diffusion involving the formation of the N region 7, the remaining group VB oxide may be sublimed by passing a gas such as argon, air, etc. over the substrate at an elevated temperature for a short period of time. The necessity of this step will be governed by the depth of the diffusion necessary to produce the N region 7 to the desired thickness. The substrate 1 is then exposed to a chemically reducing atmosphere which reduces the group IIIB oxide, and, in the presence of heat, permits the group IIIB conductivity type determining impurity to diffuse into the semiconductor substrate 1 into the region 7 and to convert a portion of that region to a region of P conductivity type semiconductor material 10 with the formation of a PN junction 9 insofar as the quantity of P conductivity type determining impurity diffused in exceeds and predominates over the N conductivity type determining impurities already present in the region.

In order to aid in understanding and practicing the invention, the following specific example of the formation of a PNP structure is provided, it being understood that no limitation should be construed thereby since as will be apparent to one skilled in the art, a plurality of such specifications would be readily available.

*Example A*

A PNP structure in germanium is provided by coating, in connection with FIGURES 1 through 4, a P type germanium wafer 1 with a mixture 3 of oxides of P and N type conductivity type determining impurities. The wafer 1 of monocrystalline P type germanium was coated with a solution of gallium nitrate and nitric acid, $$Ga(NO_3)_3+HNO_3$$

the wafer was then heated in air at 500° for half an hour thereby converting the $GaNO_3$ to $Ga_2O_3$. A solution of antimony pentachloride, $SbCl_5$, was then applied to the wafer. The wafer was heated in air for fifteen and one half hours at 700° C. for diffusion. Thermo-electric probing showed the surface to be N type, indicating the diffusion of antimony into the germanium substrate 1. The wafer 1 was then placed in a quartz tube which was then evacuated and heated at 400° C. for half an hour for the purpose of subliming away the remaining antimony trioxide $Sb_2O_3$. After admitting hydrogen at a pressure of 400 millimeters absolute, the tube was sealed off. The wafer was heated for about 2 hours at 850° C. which reduced the $Ga_2O_3$ and permitted the diffusion of gallium into the germanium substrate. The structure obtained was as is shown in FIGURE 4 where the N type region 7 was 0.0011 inch thick and the P type region 10 was 0.00005 inch thick.

*Example B*

A wafer of monocrystalline P type germanium is coated with an aqueous solution of indium trioxide $In_2O_3+H_2O$. Upon solidification of the $In_2O_3$ a coating of arsenic trioxide $As_2O_3$ is applied to the wafer. The wafer is sealed in a tube in a neutral or oxidizing atmosphere in the presence of the oxide vapor at 700° C. for fifteen hours for diffusion of the arsenic in the wafer forming a region of N conductivity type. The system is then flushed with air to remove the excess $As_2O_3$ and a hydrogen environment in the form of a stream or at 400 millimeters absolute pressure is then introduced and the wafer is further heated at 850° C. for two hours. The hydrogen reduced the $In_2O_3$ and at the temperature the indium diffused into the already formed N conductivity type region forming a P conductivity type region. Where the indium is in sufficient concentration a portion of the crystal will melt and upon recrystallization on cooling an alloy junction will be formed. The resulting structure may be converted into a PNP transistor by applying ohmic electrodes to the individual conductivity type regions.

What has been described is a technique for diffusion of conductivity type determining impurities to a semiconductor substrate where in the conductivity type determining impurities are held in contact with the substrate in the form of oxides and are selectively released from the oxide state through chemical reduction by the semiconductor substrate and by changes in environment.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention.

It is the intention therefore to be limited only as indicated by the scope of the following claims.

What is claimed is:

1. The method of providing a three zone alternate conductivity type semiconductor structure comprising the steps of: placing one over the other, each with a particular chemical reducing requirement, in contact with a given conductivity type germanium crystal, a first coating of an oxide of an opposite conductivity type impurity element, and a second coating of an oxide of a conductivity type determining impurity of the same type as said crystal; chemically reducing said first oxide by satisfying its particular reduction requirement; heating said crystal to a temperature and for a period of time sufficient to diffuse said opposite type impurity element into said crystal forming an opposite conductivity type region therein; exposing said crystal to sufficient hydrogen to completely reduce said second oxide coating and further heating said crystal at a temperature and for a time sufficient to permit said conductivity type determining element of the same type as said crystal to diffuse into said crystal forming a conductivity type region the same type as said crystal in said opposite conductivity type region.

2. The method of claim 1 wherein said crystal is P type, said opposite type impurity element is antimony and wherein said conductivity type determining impurity the same type as said crystal is gallium.

3. The method of claim 1 wherein said crystal is P conductivity type, said opposite conductivity type element is indium and wherein said conductivity type element the same type as said crystal is arsenic.

4. The method of providing a three zone alternate conductivity type semiconductor structure comprising the steps of: placing in contact with a given conductivity type germanium crystal a first coating of an oxide of an opposite conductivity type impurity element capable of being reduced by said crystal, thereover coating said first coating with a second coating of an oxide of a conductivity type determining impurity of the same type as said crystal; heating said crystal to a temperature and for a period of time sufficient to diffuse said opposite type impurity element into said crystal forming an opposite conductivity type region therein; exposing said crystal to sufficient hydrogen to completely reduce said second oxide coating; and further heating said crystal at a temperature and for a time sufficient to permit said conductivity type determining impurity element of the same type as said crystal to alloy into said crystal forming a conductivity type region the same type as said crystal in said opposite conductivity type region.

5. The method of performing sequential diffusions of first and second conductivity type determining impurities into a semiconductor crystal comprising the steps of: placing a first coating of a first conductivity type determining impurity in oxide form in contact with a surface of a semiconductor crystal, said first conductivity type determining impurity oxide being capable of being chemically reduced by said semiconductor crystal; placing a second coating of said second conductivity type determining impurity in oxide form in contact with said first coating on said surface of said semiconductor crystal; heating said crystal and oxide combination for a time and at a temperature sufficient to permit said semiconductor crystal to reduce said first conductivity type determining impurity oxide and to permit said first conductivity type determining impurity to diffuse into said semiconductor crystal in a concentration sufficient to alter the conductivity thereof; thereafter chemically reducing in a chemically reducing atmosphere said second conductivity type determining impurity oxide and subjecting said crystal to sufficient heat and for sufficient time to permit said second conductivity type determining impurity to diffuse into said semiconductor crystal in a concentration sufficient to alter the conductivity thereof, thereby providing a crystalline structure containing three zones of alternate conductivity type.

References Cited in the file of this patent

UNITED STATES PATENTS

| | | |
|---|---|---|
| 2,771,382 | Fuller | Nov. 20, 1956 |
| 2,794,846 | Fuller | June 4, 1957 |
| 2,804,405 | Derick et al. | Aug. 27, 1957 |
| 2,828,232 | Myer | Mar. 25, 1958 |
| 2,836,521 | Longini | May 27, 1958 |
| 2,861,018 | Fuller et al. | Nov. 18, 1958 |
| 2,873,221 | Nijland et al. | Feb. 10, 1959 |